US007074671B2

United States Patent
Lee et al.

(10) Patent No.: US 7,074,671 B2
(45) Date of Patent: Jul. 11, 2006

(54) GATE ELECTRODE OF A SEMICONDUCTOR DEVICE AND METHOD OF FORMING THE SAME

(75) Inventors: Seung-Jae Lee, Gyeonggi-do (KR); Jin-Gi Hong, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 123 days.

(21) Appl. No.: 10/626,096

(22) Filed: Jul. 23, 2003

(65) Prior Publication Data

US 2004/0126949 A1     Jul. 1, 2004

(30) Foreign Application Priority Data

Aug. 19, 2002    (KR) ................................ 2002-48979

(51) Int. Cl.
*H01L 21/336*    (2006.01)

(52) U.S. Cl. ...................... 438/257; 257/315

(58) Field of Classification Search ............... 438/201, 438/211, 257, 260, 264, 482, 486; 257/314–316, 257/239
See application file for complete search history.

(56) References Cited

U.S. PATENT DOCUMENTS

| 5,877,074 | A | | 3/1999 | Jeng et al. ................... 438/592 |
| 6,133,093 | A | * | 10/2000 | Prinz et al. ................. 438/257 |
| 6,180,454 | B1 | * | 1/2001 | Chang et al. ............... 438/257 |
| 6,235,563 | B1 | * | 5/2001 | Oka et al. ................... 438/166 |

FOREIGN PATENT DOCUMENTS

JP     6-140355     5/1994

OTHER PUBLICATIONS

English language abstract of Japanese Publication No. 6-140355.

* cited by examiner

*Primary Examiner*—David Vu
(74) *Attorney, Agent, or Firm*—Marger Johnson & McCollom, P.C.

(57) ABSTRACT

Disclosed are an electrode of a semiconductor device and a method of forming the same. A polysilicon layer is formed on a semiconductor substrate. An amorphous silicon capping layer is then formed on the polysilicon layer. A silicide layer is formed on the capping layer. The capping layer prevents chlorine ions from diffusing downward to the polysilicon layer. Accordingly, abnormal growth of the polysilicon layer can be prevented, thus improving the stability of the electrical characteristics of a semiconductor device electrode.

4 Claims, 8 Drawing Sheets

GATE ELECTRODE OF A SEMICONDUCTOR DEVICE AND METHOD OF FORMING THE SAME

BACKGROUND OF THE INVENTION

1. Field of the Invention

The present invention relates to semiconductor device fabrication and a method of forming an electrode in a semiconductor device. More particularly, the present invention relates to an electrode having a stacked structure, and a method of forming the same.

2. Description of the Related Art

Recently, a strong requirement to reduce the electrical resistance in a gate electrode in a MOS (metal oxide semiconductor) has been desired because semiconductor devices are highly integrated and formed to be a fine pattern in integrated circuits. As a result, most of the gate electrodes are formed to have a polycide structure to reduce the electrical resistance.

In more detail, as the pattern size of the integrated circuit is reduced, the width of wiring and the space between wirings must be scaled down. As a result, specific resistance in the polysilicon layer of a gate electrode becomes excessively high and the electrical characteristics of the gate electrode are deteriorated, resulting in problems such as an RC time delay or a voltage drop across the gate electrode. For this reason, a polycide layer, which is a composite layer of a polysilicon layer and a refractory metal silicide layer, is typically used as the gate electrode or wiring electrode of a bit-line in a very large scale integration (VLSI) circuit of a semiconductor device. This is because the specific resistance in the polycide is several times or several ten times lower than that of the polysilicon, even though the polycide has physical and chemical characteristics similar to that of the polysilicon.

The refractory metal silicide of a refractory metal such as tungsten (W), molybdenum (Mo), titanium (Ti), or tantalum (Ta) is conventionally used as a low resistance wiring material. The refractory metal silicide is combined with a highly doped polysilicon to form a gate electrode on the polycide structure. One of the preferred methods of depositing the refractory metal silicide is a low-pressure chemical vapor deposition (LPCVD).

Particularly, when a tungsten silicide layer is combined with the polysilicon layer, the tungsten silicide layer has superior process characteristics among the various refractory metal silicides, such as: self-passivation, stability to chemicals in wet etching, surface roughness, adhesion, an oxidation degree, and reproducibility. The tungsten silicide layer is deposited on a semiconductor substrate by using reaction gases, such as a silane ($SiH_4$) gas and a tungsten hexafluoride ($WF_6$) gas, as precursor gases through the LPCVD process.

However, the above depositing process has some problems. One of the problems is that the tungsten silicide is anisotropically deposited in a stepped area.

Another problem is that the amount of residual fluoride within the deposited tungsten silicide layer is large enough to seriously damage the performance of the semiconductor device. For example, when a semiconductor wafer is exposed at a temperature of more than 850° C., extra fluoride ions ($F^-$) pass through the polysilicon layer to the silicon oxide layer at the bottom of the polysilicon layer. Therefore, the effective thickness of the silicon oxide layer is increased, and the electrical characteristics of the semiconductor device are changed.

For this reason, a dichlorosilane ($SiH_2Cl_2$, hereinafter referred to as DCS) gas has been suggested instead of the silane ($SiH_4$) gas in depositing the tungsten silicide layer. It has been confirmed that the tungsten silicide layer deposited by using the DCS gas (DCS tungsten silicide layer) has lower fluorine residues and superior step-coverage than the tungsten silicide layer deposited by using the mono-silane gas (MS tungsten silicide layer). Therefore, the DCS tungsten silicide layer has been more widely used than the MS tungsten silicide layer in word lines, which can be gate electrodes, or the wiring material of a bit-line in VLSI circuits. However, chlorine radicals remain on the surface and in the DCS tungsten silicide layer when the DCS gas reacts with the tungsten hexafluoride ($WF_6$) gas, causing a variety of problems in the semiconductor device.

Generally, the DCS tungsten silicide layer is deposited at a temperature of 620° C., which is about 200° C. higher than the deposition temperature of the MS tungsten silicide layer, and has a columnar structure in which a hexagonal phase and a tetrahedral site coexist. Further, the DCS tungsten silicide layer has a body-centered cubic (bcc) structure in which a tungsten atom forms covalent bonds with eight silicon atoms. Extra silicon atoms unrelated to the covalent bonds form stacking faults. These extra silicon atoms combine with the chlorine radicals, which are dissociated from the DCS gas, to produce a silicon chloride ($SiCl_x$, wherein x is a positive number) crystal.

Simultaneously, the dissociated chlorine radicals also break the Si—H bonds or Si—Si bonds so that the dissociated chlorine radicals combine with the silicon atoms. Then, the dissociated extra silicon atoms recombine with the chlorine radicals to produce the silicon chloride crystals. The above sequential dissociation and crystallization by the chlorine radicals is repeatedly created through the tungsten silicide layer to the polysilicon layer like dominoes, so that the chlorine atoms concentrated on the boundary surface between the tungsten silicide layer and the polysilicon layer.

Furthermore, when completing an annealing process at a temperature of about 800° C., the tungsten silicide layer has a tetrahedral crystal structure site and stable stoichiometry. As a result, since the silicon atoms are relatively more abundant on the polysilicon layer, the chlorine atoms are more concentrated near the polysilicon layer, which is estimated from the amount of the silicon chloride crystals.

The abundant silicon chloride crystals, which remain in the DCS tungsten silicide layer and on the surface of the polysilicon layer underlying the DCS tungsten silicide layer, scatter light. The scattering light causes a visual defect called a galaxy phenomenon. Namely, the silicon chloride crystals are observed as a set of sparkling points when observed through an optical microscope. The above visual defects have undesirable effects on the subsequent photolithography process, and cause manufacturing failures of the semiconductor device.

In addition, the chlorine atoms remaining in the DCS tungsten silicide layer and on the surface of the DCS tungsten silicide layer, are diffused into the whole boundary surface of the DCS tungsten silicide layer and the polysilicon layer in the shape of silicon chloride crystals, which cause the abnormal growth of the polysilicon layer.

Additionally, the post flushing process using a mono-silane gas after depositing the DCS tungsten silicide layer, continuously supplies extra silicon atoms to the tungsten silicide layer. This diffusion of extra silicon atoms causes local growing and crystallization of the amorphous polysilicon layer. A plurality of cracks are sporadically formed on a surface of the DCS tungsten silicide layer, which is called a Haze phenomenon.

When the tungsten silicide layer is deposited using the DCS, the abnormal growth of the polysilicon layer underlying the tungsten silicide layer poses a serious problem. A mechanism of the abnormal growth of the polysilicon layer is known as follows: When the tungsten silicide layer is deposited using the DCS, chlorine ions are diffused and exist in grain boundaries of the polysilicon layer. Next, the silane ($SiH_4$) gas is supplied and undergoes pyrolysis. Then, the dissociated silicon ions ($Si^{4+}$) are diffused to react with the chlorine ions. As a result, the polysilicon layer abnormally grows.

Figure 1:
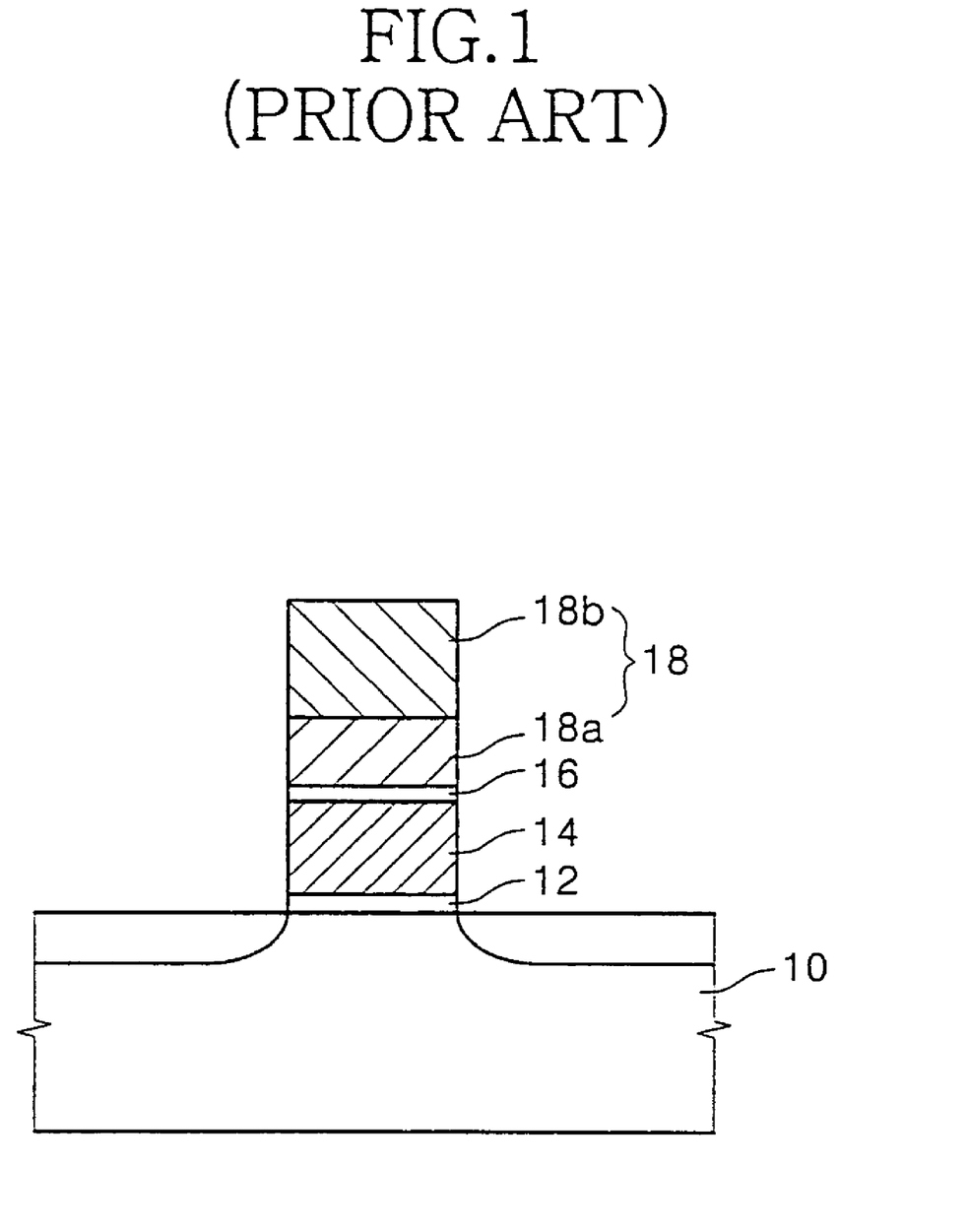
FIG. 1 is a cross sectional view showing a conventional structure of a gate electrode of a non-volatile memory device.

FIG. 1 is a cross sectional view showing the structure of a gate electrode of a conventional non-volatile semiconductor memory device.

Referring to FIG. 1, a gate electrode is formed to have a sequentially stacked structure of a gate insulation layer 12, a floating gate electrode layer 14, a dielectric layer 16, and a control gate electrode layer 18.

While the floating gate electrode layer 14 is formed in a cell area, the control gate electrode layer 18 is formed into a wiring line through which a control signal is applied. Therefore, the control gate electrode layer 18, which is formed of a polysilicon layer 18a and a metal silicide layer 18b requires a low-resistance characteristic.

FIGS. 2A to 2D are cross sectional views showing the method of forming a tungsten silicide gate electrode layer for a conventional non-volatile semiconductor memory device.

Figure 2A:
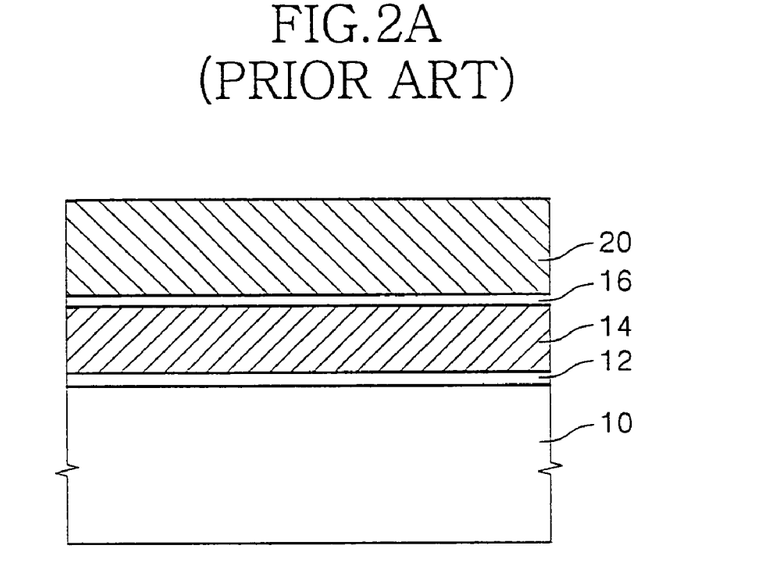
FIGS. 2A to 2D are cross sectional views showing a conventional method of forming a tungsten silicide gate electrode layer of the non-volatile memory device.

Referring to FIG. 2A, a gate insulation layer 12 is first formed on a semiconductor substrate 10, such as a silicon substrate, so as to form a gate electrode of a conventional non-volatile memory device. A tunneling area for writing and erasing data is formed on at least a portion of the gate insulation layer 12.

A polysilicon layer is deposited on the gate insulation layer 12 to form a floating gate electrode layer 14. A dielectric layer 16 is then formed on the polysilicon layer. For example, the dielectric layer 16 can be formed to have a stacked composite layer of oxide layer, nitride layer, and oxide layer. Next, an amorphous silicon layer 20 is deposited on the dielectric layer 16 to a thickness of about 2000 Å.

Figure 2B:
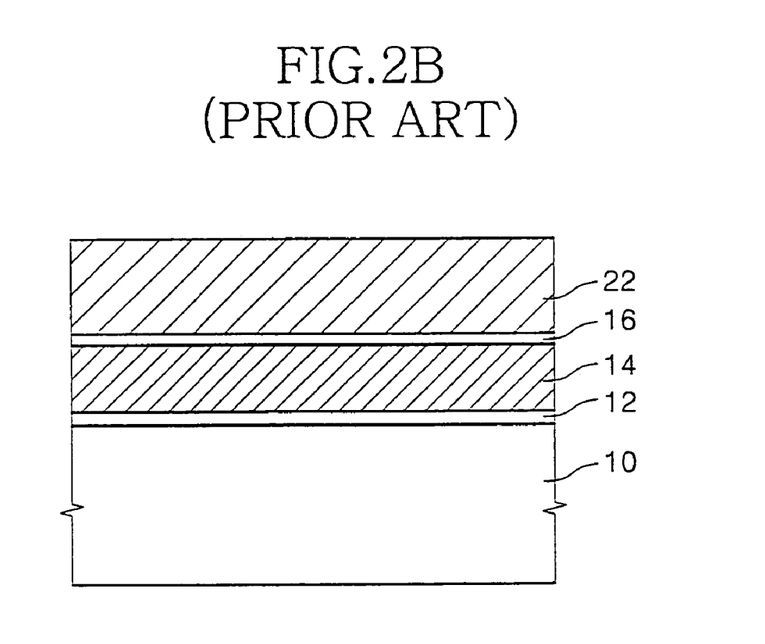

Referring to FIG. 2B, then, the amorphous silicon layer 20 is annealed in a nitrogen ambient to form a polysilicon layer 22. In more detail, the wafer including the amorphous silicon layer is introduced into a process chamber and annealed at a temperature of about 850° C. for 30 minutes while a nitrogen gas is supplied to the chamber. When the annealing process is completed, the amorphous silicon from the amorphous silicon layer 20 becomes crystallized, and the polysilicon layer 22 is formed on the dielectric layer 16 with a predetermined grain size.

Figure 2C:
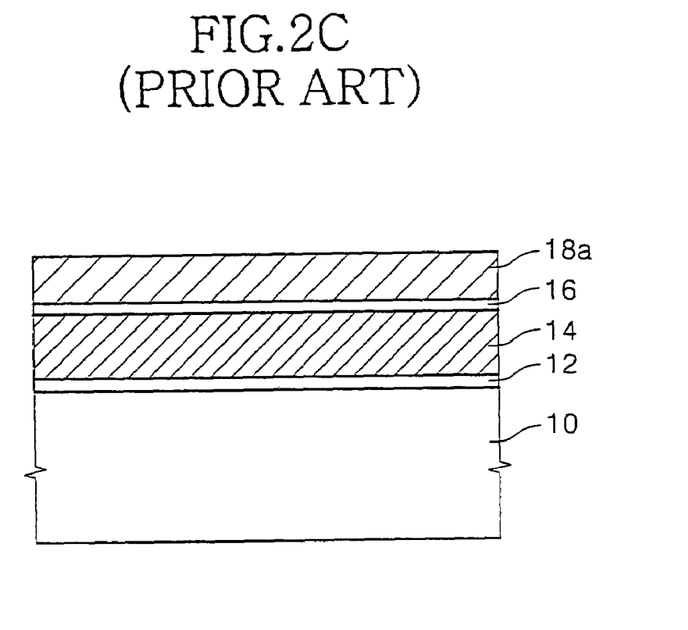

Subsequently, as shown in FIG. 2C, the polysilicon layer 22 is etched through an etch-back process in an etching chamber so that the thickness of the remaining polysilicon layer 18a is about 1000 Å. When the etch-back process is completed, the wafer is cleaned through a cleaning process in a cleaning chamber, and loaded into a tungsten silicide process chamber.

In the tungsten silicide process chamber, the wafer is heated up and a silane ($SiH_4$) gas is introduced into the chamber to perform a surface treatment of the wafer, called a pre-flushing process. This prevents chlorine ions used in the subsequent process from diffusing towards a lower layer. Next, the silicon atoms on the wafer surface are combined with hydrogen, which is pyrolized from the silane $SiH_4$ gas, so that a buffer layer of hydrogen radicals is formed on the surface of the wafer.

Subsequently, a mixture of DCS gases and tungsten hexafluoride ($WF_6$) gases is introduced into the chamber. As a result, the hydrogen radicals on a surface of the remaining polysilicon layer 18a react with the fluoride radicals and chlorine radicals to produce volatile fluoride ($Fl_2$) gases, chlorine ($Cl_2$) gases, and silane ($SiH_4$) gases. Therefore, only silicon atoms and tungsten atoms remain on the surface of the remaining polysilicon layer 18a, and combine together to deposit a tungsten silicide layer 18b.

However, a portion of the chlorine ions are diffused downwardly towards the remaining polysilicon layer 18a, and gather on grain boundaries of the polysilicon. The grain boundaries of the polysilicon can easily capture impurities, such as a chlorine ion ($Cl^-$), because of the boundary conditions.

Then, the remaining DCS gas is purged out from the process chamber, and post-treatment silane ($SiH_4$) gases are supplied to the chamber. The post-treatment silane ($SiH_4$) gases can remove residual chlorine ions by reacting with pyrolized hydrogen ions.

Figure 2D:
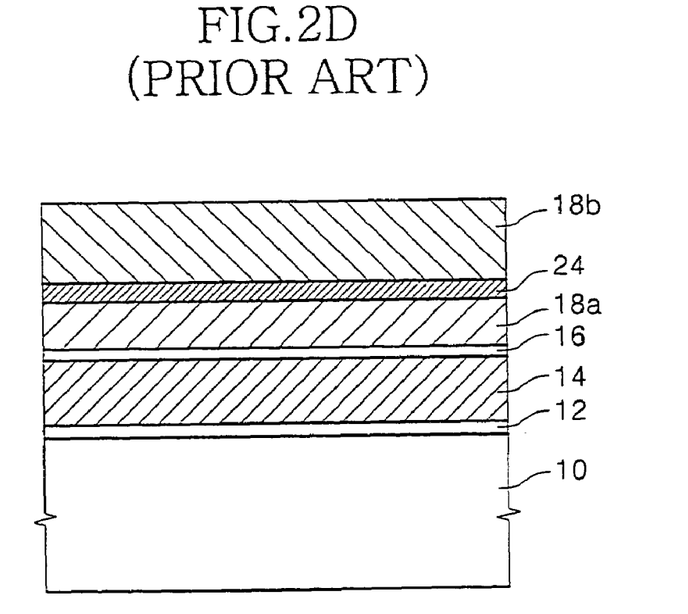

At this time, silicon ions ($Si^{4-}$) dissociated from the post-treatment silane ($SiH_4$) gases, diffuse downward to the remaining polysilicon layer 18a, and react with the chlorine ions ($Cl^-$) gathered on the grain boundary. This produces undesired silicon crystals between the remaining polysilicon layer 18a and the tungsten silicide layer 18b as shown in FIG. 2D. Therefore, an undesired polysilicon layer 24 is formed on the surface of the remaining polysilicon layer 18a.

Figure 3:
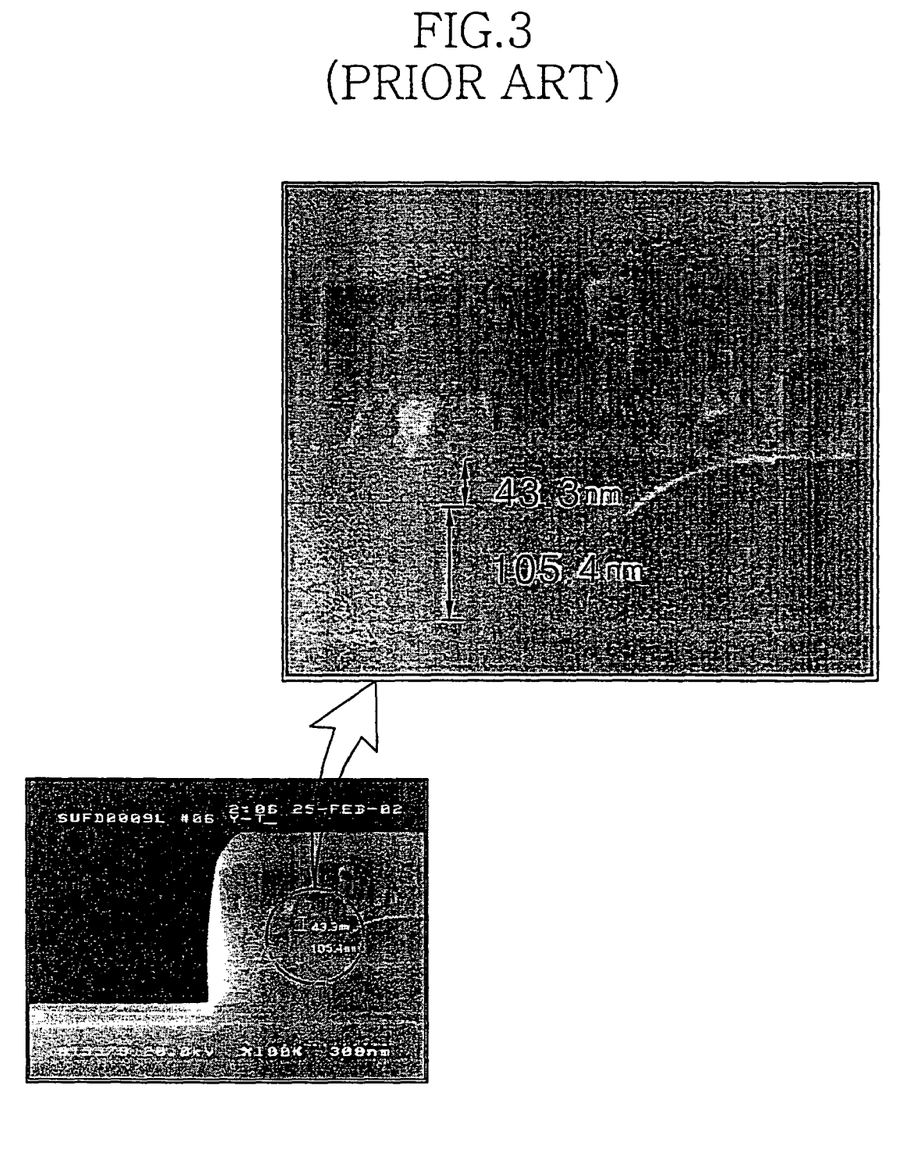
FIG. 3 is a scanning electron microscope (SEM) photograph showing an abnormal growth of a polysilicon layer in a tungsten silicide gate electrode layer as shown in FIGS. 2A to 2D.

FIG. 3 is a scanning electron microscope (SEM) photograph showing an abnormal growth of a polysilicon layer in a tungsten silicide gate electrode as shown in FIGS. 2A to 2D.

As shown in FIG. 3, since the initial thickness of the remaining polysilicon layer is about 1054 Å, it can be noted that the remaining polysilicon layer has abnormally grown to a thickness of about 433 Å after depositing the tungsten silicide layer. Such an abnormal growth of the polysilicon layer underlying the tungsten silicide layer eventually applies mechanical and physical stresses onto the entire gate electrode of the semiconductor device. On occasion, this heavy stress can cause the gate electrode layer to be floated, causing various electrical characteristics of the gate electrode to be deteriorated.

SUMMARY OF THE INVENTION

In one embodiment of the present invention, a polysilicon layer is formed on a semiconductor substrate. An amorphous silicon capping layer is then formed on the polysilicon layer. A silicide layer is formed on the capping layer. The capping layer prevents chlorine ions from diffusing downward to the polysilicon layer.

Preferably, the thickness of the thin film of amorphous silicon is not less than 50 Å to prevent chlorine ions dissociated from the DCS gas from diffusing downward to the polysilicon layer. Further, the polysilicon layer is preferably formed of polysilicon or amorphous silicon.

In another embodiment of the present invention, a gate electrode of a semiconductor memory device includes a gate oxide layer formed on a semiconductor substrate, a floating gate electrode formed on the gate oxide layer, a dielectric layer formed on the floating gate electrode, a polysilicon layer formed on the dielectric layer by crystallizing an amorphous silicon, a capping layer formed on the polysilicon layer, and a tungsten silicide layer formed on the capping layer by using a DCS reaction is provided. The capping layer prevents chlorine ions from diffusing downward to the polysilicon layer so that an abnormal growth of the polysilicon layer is prevented.

In the present invention, the abnormal growing of the polysilicon layer is prevented because the concentration of the chlorine ions on the grain boundaries of the polysilicon layer is prevented. As a result, the mechanical and electrical characteristics of the electrode of the semiconductor device are stable.

BRIEF DESCRIPTION OF THE DRAWINGS

The above objects and advantages of the present invention will become more readily apparent by describing in detail exemplary through the following detailed description of preferred embodiments thereof, made with reference to the attached drawings, in which.

DESCRIPTION OF THE PREFERRED EMBODIMENTS

Hereinafter, the preferred embodiments of the present invention will be described in detail with reference to the accompanying drawings.

Figure 4:
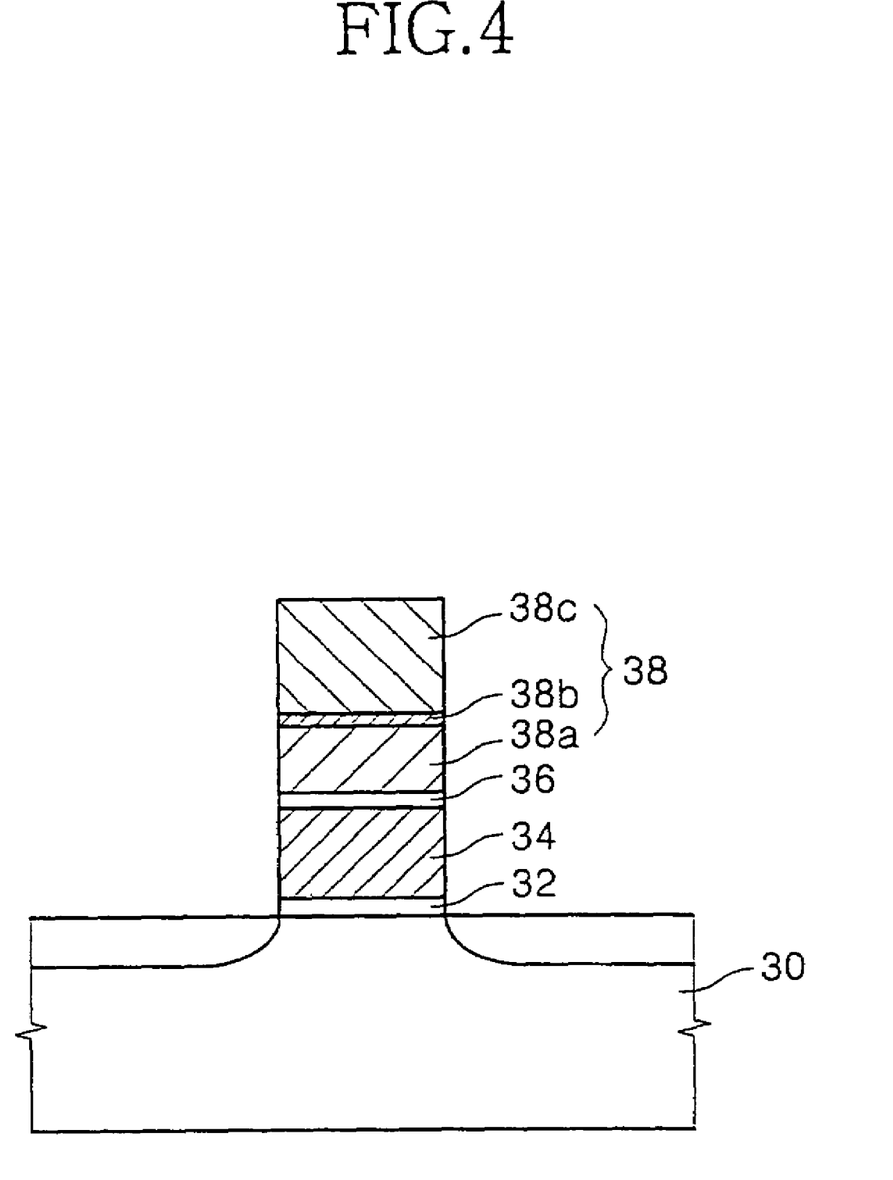
FIG. 4 is a cross sectional view showing a structure of a gate electrode of a non-volatile memory device according to an embodiment of the present invention.

FIG. 4 is a cross sectional view showing a structure of a gate electrode of a non-volatile semiconductor memory device according to an embodiment of the present invention.

Referring to FIG. 4, a gate electrode includes a gate insulator 32, a floating gate electrode 34, an intergate dielectric layer 36, and a control gate electrode layer 38, which are sequentially stacked, on a semiconductor substrate, such as a silicon substrate. The control gate electrode 38 can be formed to have a sequentially stacked structure of a polysilicon layer 38a, an amorphous-silicon capping layer 38b, and a silicide layer 38c such as a tungsten silicide layer. The capping layer 38b prevents chlorine ions ($Cl^-$) from diffusing downwardly to the polysilicon layer 38a, so that the polysilicon layer 38a cannot be abnormally grown.

FIGS. 5A to 5E are cross sectional views showing the tungsten silicide gate electrode layer of a non-volatile memory device according to an embodiment of the present invention.

Figure 5A:
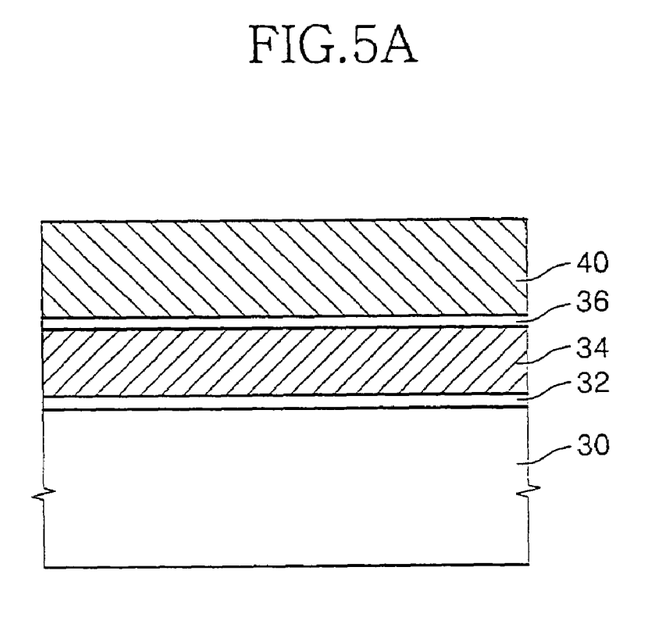
FIGS. 5A to 5E are cross sectional views showing a tungsten silicide gate electrode layer of a non-volatile memory device according to an embodiment of the present invention.

Referring to FIG. 5A, a gate insulation layer 32 is first formed on a semiconductor substrate 30, such as a silicon substrate, so as to form a gate electrode of the non-volatile memory device, such as an electrical erasable programmable read only memory (EEPROM) or a flash memory. A tunneling area for writing and erasing data is formed on at least a portion of the gate insulation layer 32.

A polysilicon layer is deposited on the gate insulation layer 32 to form a floating gate electrode layer 34. An intergate dielectric layer 36 is then formed on the polysilicon layer. Preferably, the dielectric layer 36 can be formed into a sequentially stacked composite layer of an oxide layer, a nitride layer, and an oxide layer, i.e., an oxidenitride-oxide (ONO) layer. Next, an amorphous silicon layer 40 is preferably deposited on the dielectric layer 36 to a thickness of about 2000 Å.

Figure 5B:
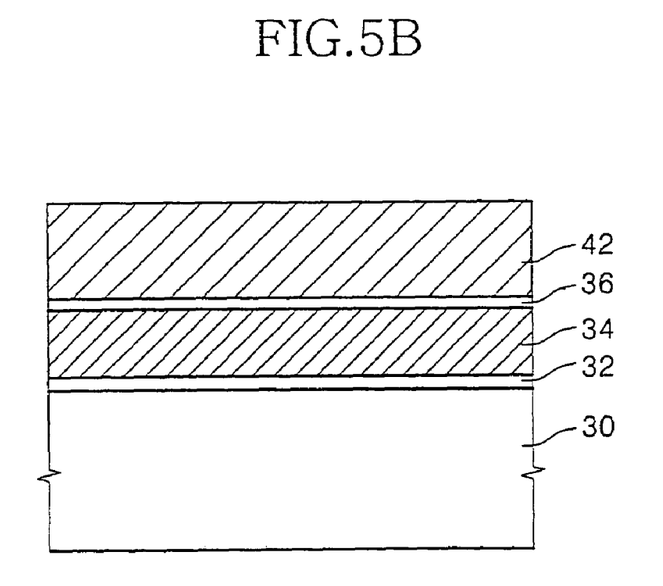

Referring to FIG. 5B, the amorphous silicon layer 40 is then annealed in a nitrogen ambient to form a polysilicon crystal 42 shown in FIG. 5B. In more detail, preferably, the wafer including the amorphous silicon layer is introduced into a process chamber and annealed at a temperature of about 850° C. for about 30 minutes while nitrogen gas is supplied to the chamber. When the annealing process is completed, the amorphous silicon from the amorphous silicon layer 40 becomes crystallized, and a polysilicon layer 42 is formed on the dielectric layer 36 with a predetermined grain size.

Figure 5C:
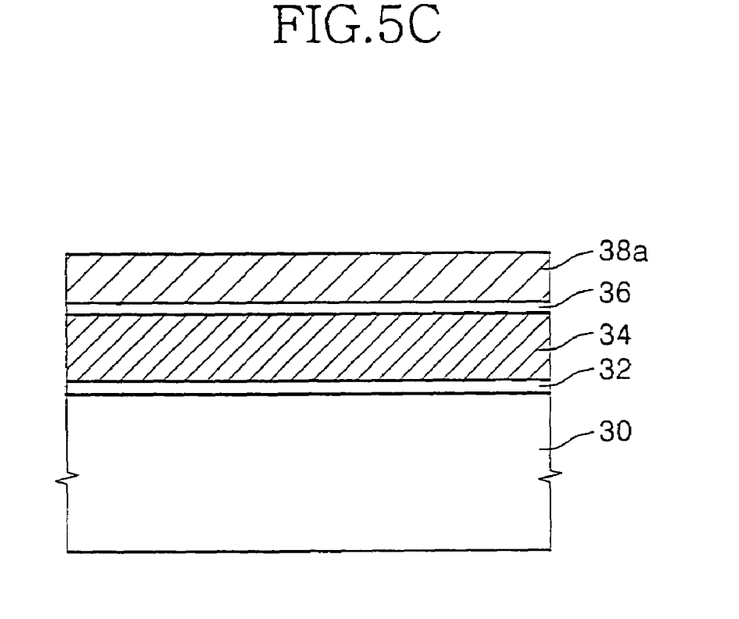

Turning to FIG. 5C, subsequently, as shown in FIG. 5C, the polysilicon layer 42 is etched through an etch-back process in an etching chamber so that the thickness of the remaining polysilicon layer 38a is preferably about 1000 Å. When the etch-back process is completed, the wafer is cleaned through a cleaning process in a cleaning chamber, and loaded into a chemical vapor deposition (CVD) process chamber for depositing again amorphous silicon on the wafer.

Figure 5D:
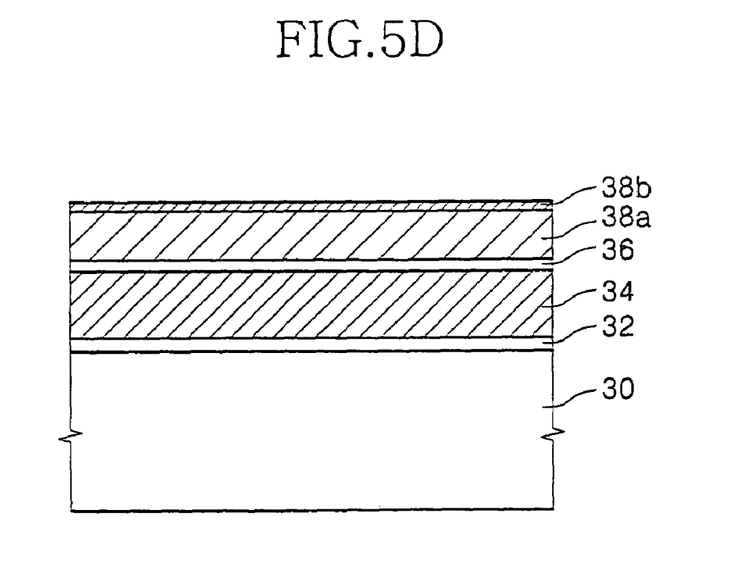

In the CVD process chamber, the amorphous silicon layer is deposited on the wafer to a thickness of about 50 Å or more, thus forming a capping layer 38b as shown in FIG. 5D. The capping layer 38b does not have grain boundaries because it is formed of amorphous silicon. It is also formed to have a sufficient thickness for preventing chlorine ions, e.g., resulting from the subsequent fabrication process, from diffusing downward to the remaining polysilicon layer 38a.

When the deposition process of the capping layer 38b on the wafer is completed, the wafer is then loaded into a chamber for depositing a silicide layer such as a tungsten silicide layer on the wafer.

In the chamber, the wafer is heated up and silane ($SiH_4$) gas is introduced into the chamber to perform a surface treatment of the wafer, called a pre-flushing process. This prevents chlorine ions used in the following process from diffusing downward to a lower layer. Next, the silicon atoms on the wafer surface are combined with hydrogen, which is pyrolized from the silane $SiH_4$ gas, so that a buffer layer of hydrogen radicals are formed on the surface of the wafer.

Subsequently, a DCS gas and a tungsten hexafluoride ($WF_6$) gas are mixed at a predetermined volume ratio, and the gas mixture is introduced into the chamber through a gas distribution plate. The DCS gas and tungsten hexafluoride gas are mixed at a proper volume ratio to deposit a silicon-rich tungsten silicide layer. Then, the hydrogen radicals on the surface of the remaining polysilicon layer 38a react with chlorine radicals dissociated from the DCS gas to produce hydrogen chloride (HCl). The hydrogen chloride (HCl) gas is exhausted outward as a waste gas, and the chlorine radicals are prevented from accumulating in the polysilicon layer.

Figure 5E:
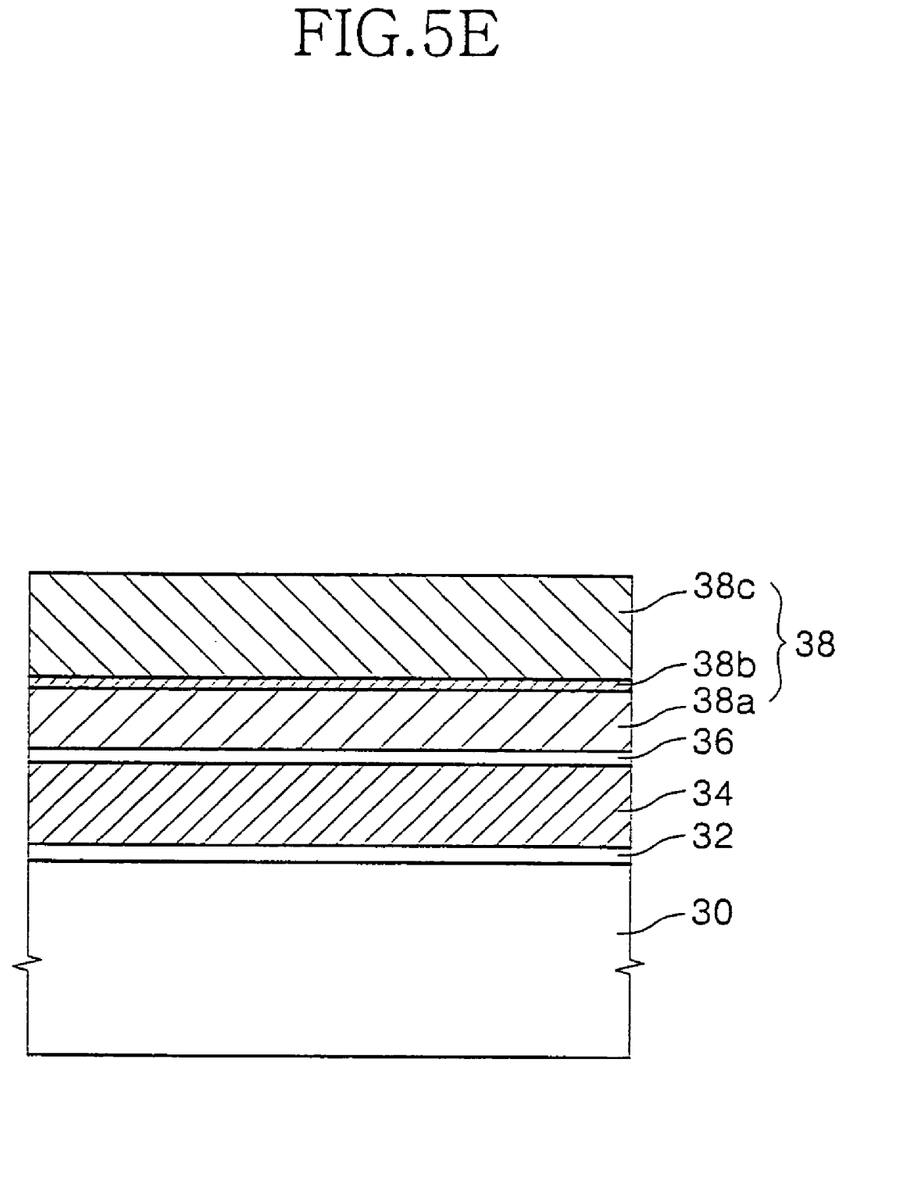

Accordingly, only silicon atoms and tungsten atoms remain on the surface of the remaining polysilicon layer 38a, and they combine together to deposit the tungsten silicide layer 38c as shown in FIG. 5E. Downward diffusion of chlorine ions is prevented by the capping layer 38*b*, and therefore abnormal growth of the polysilicon layer can be prevented. Furthermore, since the capping layer 38*b* is formed of amorphous silicon, and does not have grain boundaries, the chlorine ions react with the hydrogen radicals on the capping layer 38*b* and are exhausted in the air.

Then, the remaining DCS gas is purged out from the process chamber, and post-treatment silane ($SiH_4$) gas is supplied to the process chamber for a post-flush process. The post-flush process is performed to prevent residual chlorine ions from remaining in the chamber and adhering to the surface of the tungsten silicide layer 38*c*, and to release any mechanical stress of the tungsten silicide layer 38*c*.

According to a preferred embodiment of the present invention, a polysilicon layer is capped with an amorphous silicon layer so that chlorine ions are prevented from diffusing downward to the polysilicon layer. Therefore, abnormal growth of the polysilicon layer can be prevented, thus improving the stability of the electrical characteristics of a semiconductor device.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A method for forming a control gate electrode layer of a semiconductor device electrode in which a gate insulation layer, a polysilicon layer for a floating gate electrode, and an intergate dielectric layer are sequentially stacked on a semiconductor substrate, the method comprising:
    a) forming an amorphous silicon layer on the intergate dielectric layer;
    b) annealing the amorphous silicon to form a polysilicon layer;
    c) forming an amorphous silicon capping layer on the polysilicon layer; and
    d) forming a silicide layer on the capping layer, using dichlorosilane, wherein the silicide layer comprises tungsten silicide, and wherein forming the tungsten silicide layer comprises;
    supplying a first silane ($SiH_4$) gas to a process chamber in which a wafer including the thin film of amorphous silicon is loaded;
    supplying a dichlorosilane ($SiH_2Cl_2$) gas and a tungsten hexafluoride ($WF_6$) gas to the process chamber to deposit the tungsten silicide layer on the capping layer;
    purging the dichlorosilane ($SiH_2Cl_2$) gas and the tungsten hexafluoride ($WF_6$) gas from the process chamber; and
    supplying a second silane ($SiH_4$) gas to the process chamber.

2. The method of claim 1, wherein the annealing is performed in a nitrogen ambient.

3. The method of claim 1, wherein the thickness of the amorphous silicon capping layer is not less than 50 Å.

4. The method of claim 1, wherein the silicide layer comprises tungsten silicide.

* * * * *